(12) United States Patent
Sato

(10) Patent No.: US 11,515,868 B2
(45) Date of Patent: Nov. 29, 2022

(54) ELECTRONIC CIRCUIT AND SEMICONDUCTOR MODULE

(71) Applicant: FUJI ELECTRIC CO., LTD., Kawasaki (JP)

(72) Inventor: Tadahiko Sato, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/329,615

(22) Filed: May 25, 2021

(65) Prior Publication Data
US 2022/0014184 A1 Jan. 13, 2022

(30) Foreign Application Priority Data
Jul. 9, 2020 (JP) .............. JP2020-118251

(51) Int. Cl.
*H03K 17/08* (2006.01)
*H03K 17/0812* (2006.01)
*H02M 1/08* (2006.01)
*H02M 1/00* (2006.01)

(52) U.S. Cl.
CPC ..... *H03K 17/08122* (2013.01); *H02M 1/0009* (2021.05); *H02M 1/08* (2013.01)

(58) Field of Classification Search
CPC ............... H03K 17/08; H03K 17/081; H03K 17/08104; H03K 17/08116; H03K 17/0812; H03K 17/08122; H03K 17/08128; H03K 17/0814; H03K 17/08142; H03K 17/08148; H03K 17/082; H03K 17/0822; H03K 17/0828; H03K 17/687; H03K 17/6871; H02M 1/009; H02M 1/08; H02M 1/088
See application file for complete search history.

(56) References Cited

U.S. PATENT DOCUMENTS

| 2013/0062626 A1* | 3/2013 | Takao | H01L 21/8258 257/77 |
| 2013/0153900 A1* | 6/2013 | Kinouchi | H01L 29/66068 257/48 |
| 2017/0358512 A1* | 12/2017 | Kakimoto | H03K 17/08 |

FOREIGN PATENT DOCUMENTS

| JP | 2016-225695 A | 12/2016 |
| JP | 2018-170414 A | 11/2018 |

* cited by examiner

Primary Examiner — Long Nguyen
(74) Attorney, Agent, or Firm — Rabin & Berdo, P.C.

(57) ABSTRACT

An electronic circuit, including a first switching device that contains a first semiconductor material with a first band gap, and a second switching device that is coupled in parallel to the first switching device, and contains a second semiconductor material with a second band gap smaller than the first band gap. Each of the first and second switching devices has a control electrode, and the control electrode of the first switching device is coupled to the control electrode of the second switching device.

15 Claims, 10 Drawing Sheets

ELECTRONIC CIRCUIT AND SEMICONDUCTOR MODULE

CROSS-REFERENCE TO RELATED APPLICATION

The present application claims priority pursuant to 35 U.S.C. § 119 from Japanese patent application number 2020-118251 filed on Jul. 9, 2020, the entire disclosure of which is hereby incorporated by reference herein.

BACKGROUND

Technical Field

The present disclosure relates to an electronic circuit and a semiconductor module.

Description of the Related Art

In the technical field of a power semiconductor using SiC, there is an electronic circuit in which one of multiple switching devices that are coupled in parallel is configured to sense a current flowing through other switching devices (for example, Japanese Patent Application Publication No. 2016-225695).

Moreover, there is known an electronic circuit in which a switching device using SiC and a switching device using Si are coupled in parallel (for example, Japanese Patent Application Publication No. 2018-170414).

In the electronic circuit using SiC described in Japanese Patent Application Publication No. 2016-225695, a parasitic diode of the switching device that senses the current may have a defect caused by energization. Moreover, the size of the SiC chip increases corresponding to an area occupied by the switching device that senses the current, which hinders cost reduction.

Moreover, in the electronic circuit described in Japanese Patent Application Publication No. 2018-170414, the switching device using SiC and the switching device using Si are independently driven by two different drivers. Accordingly, the area corresponding to the semiconductor device increases, and control of the electronic circuit is complicated, which hinders cost reduction.

The present disclosure is directed to provision of a technique capable of sensing of a current flowing through a switching device with a low-cost configuration.

SUMMARY

An aspect of the present disclosure is an electronic circuit, comprising: a first switching device that contains a first semiconductor material with a first band gap; and a second switching device that is coupled in parallel to the first switching device, and contains a second semiconductor material with a second band gap smaller than the first band gap, wherein each of the first and second switching devices has a control electrode, and the control electrode of the first switching device is coupled to the control electrode of the second switching device. Other features of the present disclosure will become apparent from descriptions of the present specification and of the accompanying drawings.

DETAILED DESCRIPTION

First Embodiment

<Electronic Circuit>
[Circuit Configuration]

Figure 1:
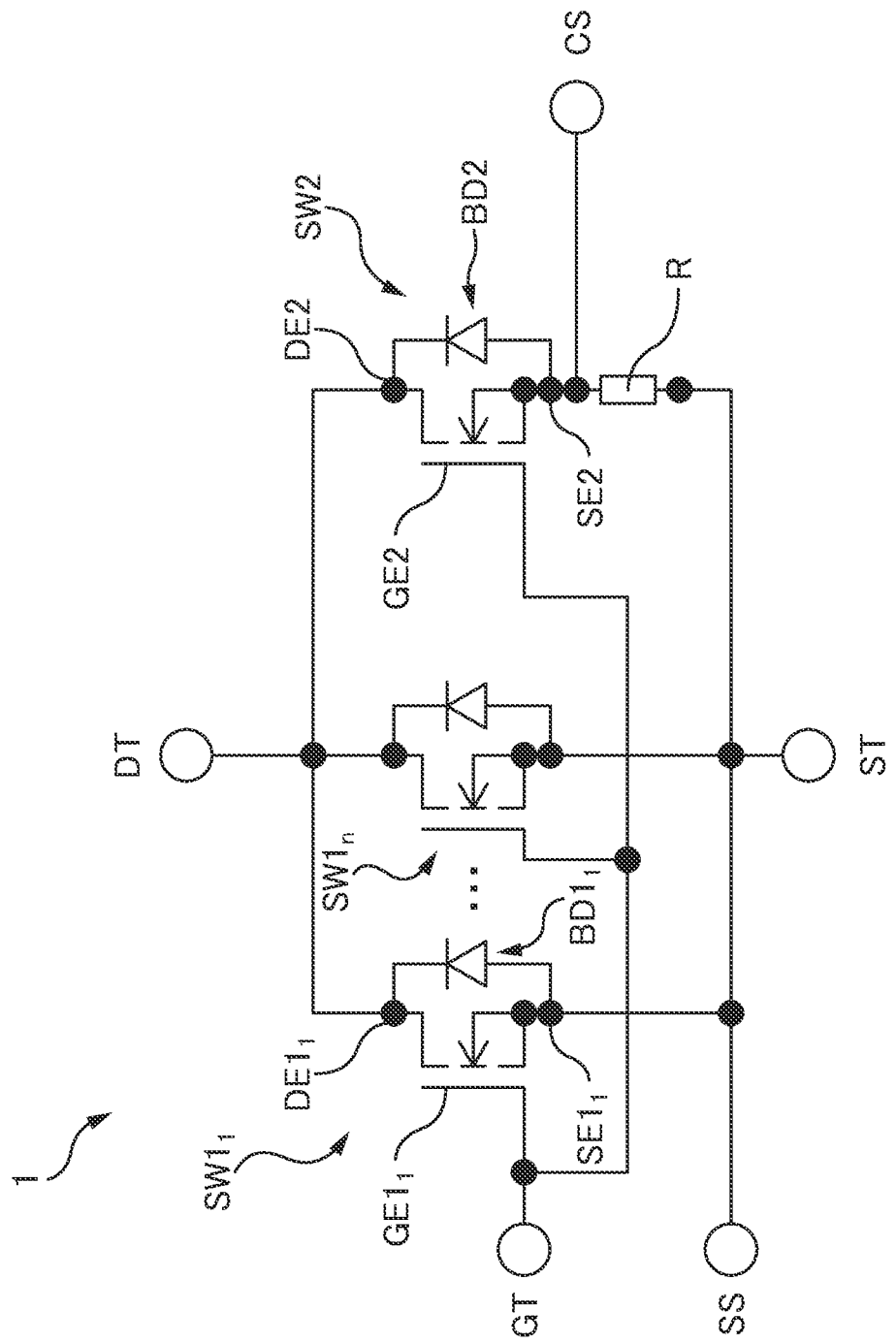
FIG. 1 is a diagram illustrating an example of an electronic circuit 1.

FIG. 1 is a diagram illustrating an example of an electronic circuit 1 according to an embodiment of the present disclosure. The electronic circuit 1 is used in, for example, a half-bridge circuit and a full-bridge circuit in the field of power electronics. The electronic circuit 1 includes n first switching devices $SW1_1$ to $SW1_n$, a second switching device SW2, a resistor R, a gate terminal GT, a source terminal ST, a drain terminal DT, a terminal SS, and a sensing terminal CS. Note that, here, "n" is an integer of 1 or higher. Accordingly, the electronic circuit 1 includes at least one first switching device SW1.

The first switching devices $SW1_1$ to $SW1_n$ are coupled to one another in parallel. In an embodiment of the present disclosure, the first switching device $SW1_1$ and other first switching devices $SW1_2$ to $SW1_n$ have the same configuration. Accordingly, the following describes focusing on the first switching device $SW1_1$.

The first switching device $SW1_1$ is a switching device using a semiconductor with a first band gap. The semiconductor with the first band gap is a so-called wide band gap semiconductor. Examples of the wide band gap semiconductor include silicon carbide (SiC), gallium nitride (GaN), diamond (C), and the like. The semiconductor with the first band gap according to an embodiment of the present disclosure is SiC.

A metal-oxide-semiconductor field-effect transistor (MOSFET), an insulated gate bipolar transistor (IGBT), a bipolar transistor, or the like can be used as the first switching device $SW1_1$. The first switching device $SW1_1$ according to an embodiment of the present disclosure is an n-channel MOSFET.

The first switching device $SW1_1$ includes a gate electrode $GE1_1$, a source electrode $SE1_1$, and a drain electrode $DE1_1$. The gate electrode $GE1_1$ of the first switching device $SW1_1$ is coupled to the gate terminal GT, the source electrode $SE1_1$ is coupled to the source terminal ST, and the drain electrode $DE1_1$ is coupled to the drain terminal DT. Moreover, as described above, the first switching device $SW1_1$ is a MOSFET and thus includes a parasitic diode (i.e., body diode) $BD1_1$.

Note that the first switching devices $SW1_2$ to $SW1_n$ are coupled to the gate terminal GT, the source terminal ST, and the drain terminal DT, similarly to the first switching device $SW1_1$, and thus detailed description thereof is omitted herein. Moreover, in an embodiment of the present disclosure, the term "couple" includes to couple nodes via an element(s) such as a resistor, diode, and/or inductor, in addition to electrically coupling nodes to one another using a wire and/or the like.

The second switching device SW2 is a switching device provided to detect a current flowing between the source and the drain of each of the first switching devices $SW1_1$ to $SW1_n$. As described in detail later, provision of the second switching device SW2 enables detection of whether an overcurrent is flowing between the source and the drain of the first switching device $SW1_1$. Furthermore, provision of the second switching device SW2 enables detection of whether an overvoltage is applied between the source and the drain of the first switching device $SW1_1$.

Note that, in the following explanation, the n first switching devices $SW1_1$ to $SW1_n$ are collectively referred to as the "first switching device SW1" unless otherwise specified. In this case, description is given assuming that the first switching device SW1 includes the gate electrode GE1, the source electrode SE1, and the drain electrode DE1, and also includes the parasitic diode BD1.

Moreover, in the following explanation, a "current flowing between the source and the drain of the first switching device SW1" is also simply referred to as a "current flowing through the first switching device SW1". The same applies to the second switching device SW2.

The second switching device SW2 is a switching device using a semiconductor with a second band gap smaller than the first band gap. The semiconductor with the second band gap is, for example, a silicon (Si)-based semiconductor. Examples of the Si-based semiconductor include single crystal Si, polycrystalline Si, amorphous Si, and the like. The semiconductor with the second band gap according to an embodiment of the present disclosure is single crystal Si.

A MOSFET, an IGBT, or the like can be used for the second switching device SW2 as well, similarly to the first switching device SW1. The second switching device SW2 according to an embodiment of the present disclosure is an n-channel MOSFET, and has a gate electrode GE2, a source electrode SE2, and a drain electrode DE2. The gate electrode GE2 is coupled to the gate terminal GT, the source electrode SE2 is coupled to the source terminal ST, and the drain electrode DE2 is coupled to the drain terminal DT. Moreover, the second switching device SW2 is a MOSFET, and thus includes a parasitic diode (i.e., body diode) BD2. The second switching device SW2 is coupled to the first switching device SW1 in parallel.

Here, a relationship between device characteristics of the first switching device SW1 and the second switching device SW2 is described. In an embodiment of the present disclosure, a threshold voltage $V_{th1}$ of the first switching device SW1 is designed to be equal to or higher than a threshold voltage $V_{th2}$ of the second switching device SW2. Note that the threshold voltage of each of the first switching device SW1 and the second switching device SW2 can be adjusted based on the impurity concentration in each of semiconductor layers, the permittivity of a gate insulating layer, the thickness, the work function of the gate electrode, and/or the like.

Moreover, the withstand voltage of the first switching device SW1 is designed to be higher than the withstand voltage of the second switching device SW2. In this description, the "withstand voltage" is an off withstand voltage between the source and the drain in a state where the switching device is off, in other words, a withstand voltage with respect to avalanche breakdown. The withstand voltage of each of the first switching device SW1 and the second switching device SW2 can be adjusted based on the impurity concentration in each of the semiconductor layers, the thickness, the length of a channel, and/or the like.

The resistor R is provided to detect a current flowing between the source and the drain of the first switching device SW1 (details are described later). In an embodiment of the present disclosure, the resistor R is made of polycrystalline Si provided in the second switching device SW2.

The resistor R has one end coupled to the source electrode SE1 of the first switching device SW1 and the other end coupled to the source electrode SE2 of the second switching device SW2.

The gate terminal GT is a terminal from which a drive signal for driving the first switching device SW1 and the second switching device SW2 is outputted. The drive signal is outputted, to the gate terminal GT, from a drive circuit (not illustrated) provided outside the electronic circuit 1.

The gate electrode GE1 of the first switching device SW1 is coupled to the gate electrode GE2 of the second switching device SW2. In other words, the first switching device SW1 and the second switching device SW2 are driven in response to the drive signal from the same drive circuit, and are not independently driven by drive signals from different drive circuits. Accordingly, control of the electronic circuit 1 is not complicated.

The source terminal ST is coupled to the source electrode SE1 of the first switching device SW1. Moreover, in an embodiment of the present disclosure, the source terminal ST is grounded.

The drain terminal DT is coupled to the drain electrode DE1 of the first switching device SW1 and the drain electrode DE2 of the second switching device SW2.

The terminal (i.e., the driving terminal) SS is a ground-side terminal of the drive circuit that outputs the drive signal. The terminal SS is coupled to the source electrode SE1 of the first switching device SW1 and the one end of the resistor R. Thus, the drive circuit can drive the first switching device SW1 by using the drive signal based on the voltage at the terminal SS. However, in the electronic circuit 1, the ground-side terminal of the drive circuit may be used as the terminal ST without providing the terminal SS. Note that, in an embodiment of the present disclosure, a "voltage" at a certain node is a voltage level at the certain node with reference to the ground (0 V) unless otherwise specified.

The sensing terminal CS is a terminal for detecting a voltage of the source electrode SE2 of the second switching device SW2, in other words, a current flowing through the resistor R. The sensing terminal CS is coupled between the resistor R and the source electrode SE2 of the second switching device SW2.

As described above, in an embodiment of the present disclosure, the first switching device SW1 and the second switching device SW2 are n-channel MOSFETs. However, in the case where the first switching device SW1 and the second switching device SW2 are IGBTs, the "source" in an embodiment of the present disclosure corresponds to an "emitter" and the "drain" corresponds to a "collector". Meanwhile, in the case where the first switching device SW1 and the second switching device SW2 are bipolar transistors, the "gate" in an embodiment of the present disclosure corresponds to a "base", the "source" corresponds to an "emitter", and the "drain" corresponds to a "collector".

Moreover, the "gate electrode" in an embodiment of the present disclosure corresponds to a "control electrode", the "source electrode" corresponds to a "ground-side electrode", and the "drain" corresponds to a "power-supply-side electrode". Note that the MOSFETs including the parasitic diodes are used as the switching devices in an embodiment of the present disclosure, however, devices (e.g., IGBTs) including no parasitic diodes may be used. In this case, it is only needed to couple freewheeling diodes to the switching devices.

[Detection of Current Flowing through Second Switching Device SW2]

The following describes a method of detecting a current flowing through the second switching device SW2. The current flowing through the second switching device SW2 is equal to a current flowing through the resistor R. The current flowing through the resistor R can be detected from the voltage across the resistor R and the resistance value of the resistor R. Specifically, the voltage across the resistor R can be detected by detecting the voltage at the sensing terminal CS.

Here, the terminals SS and ST are grounded. Accordingly, the current flowing through the resistor R can be detected based on the voltage at the sensing terminal CS, in other words, the voltage at the source electrode SE2 of the second switching device SW2. Thus, the current flowing through the second switching device SW2 can be detected based on the voltage at the sensing terminal CS, in other words, the voltage at the source electrode SE2 of the second switching device SW2.

[Detection of Overcurrent]

When the electronic circuit 1 is used as, for example, a lower arm of a full-bridge circuit (not illustrated), an overcurrent may flow from an upper arm to the lower arm depending on a state of a load and/or a state of a power supply. The following describes a method of detecting whether an overcurrent is flowing between the source and the drain of the first switching device SW1, in an embodiment of the present disclosure. An overcurrent is detected when the first switching device SW1 and the second switching device SW2 are on. In the following description, it is assumed that an "overcurrent" is a state where the current flowing through the first switching device SW1 exceeds a predetermined current Io (e.g., the rated current of the first switching device SW1), which is preset as an index of an overcurrent.

A current flowing between the source terminal ST and the drain terminal DT is a sum of the current flowing through the first switching device SW1 and the current flowing through the second switching device SW2. A relationship between the current flowing through the first switching device SW1 and the current flowing through the second switching device SW2 is grasped in advance. Accordingly, the current flowing through the first switching device SW1 can be determined based on the current flowing through the second switching device SW2.

The current flowing through the second switching device SW2 can be detected based on the voltage at the source electrode SE2 of the second switching device SW2, as described above. Thus, the current flowing through the first switching device SW1 can also be detected based on the voltage at the source electrode SE2 of the second switching device SW2.

Here, the voltage at the source electrode SE2 of the second switching device SW2 in the case where the current Io flows through the first switching device SW1 is defined as a first reference voltage $V_{ref1}$. Then, when the voltage detected at the sensing terminal CS has exceeded the first reference voltage $V_{ref1}$, it can be determined that an overcurrent has flown through the first switching device SW1.

Note that, in an embodiment of the present disclosure, the detection of an overcurrent is not performed over the entire time period from when a drive signal (e.g., a high drive signal) for turning on the first switching device SW1 and the second switching device SW2 is outputted to when a drive signal for turning off these devices is outputted. Details are described below.

As described above, the threshold voltage $V_{th1}$ of the first switching device SW1 is higher than the threshold voltage $V_{th2}$ of the second switching device SW2. Accordingly, a time period from when the drive signal for turning on the first switching device SW1 and the second switching device SW2 is outputted (at time t=0) to when the first switching device SW1 is turned on (at time t=$t_1$) is different from a time period from when the drive signal is outputted to when the second switching device SW2 is turned on (at time t=$t_2$).

Specifically, after the output of the drive signal for turning on the devices, the second switching device SW2 is turned on first at the time t=$t_2$, and then the first switching device SW1 is turned on at the time t=$t_1$ ($t_1$>$t_2$).

In the following, behaviors of the first switching device SW1 and the second switching device SW2 since the output of the drive signal for turning on the first switching device SW1 and the second switching device SW2 are described in cases different in time t. Then, based on such a description of the behaviors, a time period in which an overcurrent is detected is described in detail.

0≤t<$t_2$

In this time period, both of the first switching device SW1 and the second switching device SW2 are off. Accordingly, no overcurrent is flowing through the first switching device SW1.

$t_2$≤t<$t_1$

In this time period, the first switching device SW1 is off and the second switching device SW2 is on. Accordingly, no current is flowing through the first switching device SW1 but a current is flowing through the second switching device SW2.

In this time period, since no current is flowing through the first switching device SW1, there is no need to detect an overcurrent flowing through the first switching device SW1 irrespective of the behavior of the second switching device SW2. Moreover, if the detection of an overcurrent is performed based on the voltage at the source electrode SE2 of the second switching device SW2 in this time period, there is a possibility of erroneous detection.

$t_1$≤t

In this time period, both the first switching device SW1 and the second switching device SW2 are on. Accordingly, the current flowing through the first switching device SW1 is detected based on the voltage at the source electrode SE2 of the second switching device SW2, thereby being able to detect whether an overcurrent is flowing through the first switching device SW1.

As described above, it is preferable that no detection of an overcurrent is performed based on the voltage at the source electrode SE2 of the second switching device SW2 while the first switching device SW1 is off (when t<$t_1$).

Accordingly, a predetermined time interval $t_m$ is set in advance so as to perform no detection of an overcurrent for a time period of $t_m$ from the output of the drive signal for turning on the first switching device SW1 and the second switching device SW2. Here, $t_m$ only needs to satisfy $t_1$<$t_m$, for example.

[Detection of Overcurrent]

In the case where the electronic circuit 1 is used as, for example, a lower arm of a full-bridge circuit (not illustrated) that drives an inductive load such as a motor coil and/or the like, the voltage at the terminal DT may greatly rise upon turning off of the first switching device SW1 and the second switching device SW2. The following describes a method of detecting whether an overvoltage is applied between the source and the drain of the first switching device SW1, in an embodiment of the present disclosure. The detection of an overvoltage is performed when the first switching device SW1 and the second switching device SW2 are off. In the following description, it is assumed that an "overvoltage" is a state where the voltage between the source and the drain of the first switching device SW1 exceeds a predetermined voltage Vo, which is preset as an index of an overvoltage.

The voltage at the source terminal ST is referred to as Vs, the voltage at the drain terminal DT as Vd, and the voltage between the source terminal ST and the drain terminal DT as Vds (=Vd−Vs). Behaviors of the first switching device SW1 and the second switching device SW2 are described in cases different in value of Vds. Then, based on such a description of the behaviors, a method of detecting an overvoltage is described.

Case Where Vds is Sufficiently Lower than Vo

In this case, the voltage applied between the source and the drain of the first switching device SW1 is sufficiently lower than an overvoltage.

Case where Vds is Close to Vo and does not Exceed Vo

In this case, the voltage applied between the source and the drain of the first switching device SW1 is close to an overvoltage.

Meanwhile, in the second switching device SW2, a voltage close to Vo is applied between the source and the drain thereof. In this case, in the second switching device SW2, impact ionization occurs in a depletion layer of a drain-side p-n junction and electron-hole pairs are generated.

Case Where Vds is Vo

In this case, the voltage applied between the source and the drain of the first switching device SW1 is Vo, and thus is an overvoltage.

Meanwhile, in the second switching device SW2, the generation of electron-hole pairs due to impact ionization becomes active and avalanche breakdown occurs. In other words, the withstand voltage of the second switching device SW2 is adjusted such that avalanche breakdown occurs in the second switching device SW2 when Vds is the voltage Vo which is the index of an overvoltage.

Note that, at this time, no avalanche breakdown occurs in the first switching devices SW1, since the withstand voltage of the first switching device SW1 is higher than the withstand voltage of the second switching device SW2, as described above.

A large amount of electron-hole pairs generated due to the avalanche breakdown occurring in the second switching device SW2 at this time causes a current due to the electron holes to flow through the resistor R. Through detecting this current due to the electron holes, it can be detected that an overvoltage is applied to the first switching device SW1. The current due to the electron holes can be detected based on the voltage at the source electrode SE2 of the second switching device SW2 as described above.

Here, the voltage at the source electrode SE2 of the second switching device SW2 upon occurrence of the avalanche breakdown is defined as a second reference voltage $V_{ref2}$. Then, when the voltage detected at the sensing terminal CS exceeds the second reference voltage $V_{ref2}$, it can be determined that an overvoltage is applied to the first switching device SW1.

<Semiconductor Module>

Figure 2:
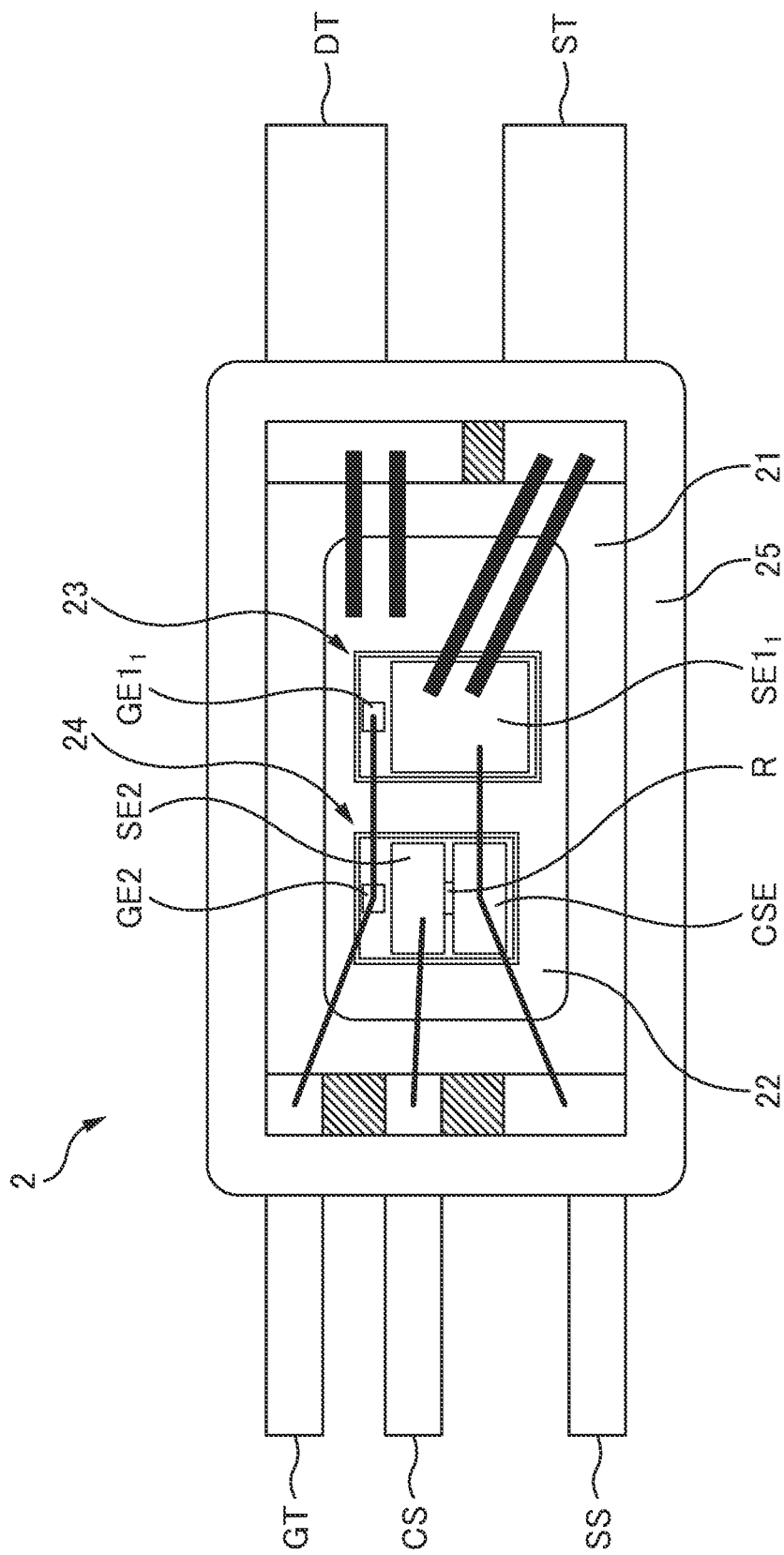
FIG. 2 is a diagram illustrating an example of a configuration of a semiconductor module 2.

FIG. 2 is a diagram illustrating an example of a configuration of a semiconductor module 2 according to an embodiment of the present disclosure. The semiconductor module is a semiconductor module including the aforementioned electronic circuit 1. Note that, although FIG. 1 illustrates an aspect in which the electronic circuit 1 includes the n first switching devices $SW1_1$ to $SW1_n$, FIG. 2 illustrates an aspect in which the semiconductor module 2 includes a single first switching device $SW1_1$.

The semiconductor module 2 includes an insulating plate 21, a conductive pattern 22, a first semiconductor chip 23, a second semiconductor chip 24, the gate terminal GT, the source terminal ST, the drain terminal DT, the terminal SS, the sensing terminal CS, and a case 25.

The insulating plate 21 is made of, for example, ceramic, resin, or the like. The conductive pattern 22 is formed on a surface of the insulating plate 21 and is made of, for example, copper, aluminum, or alloy including them.

The first semiconductor chip 23 is provided with the first switching device $SW1_1$. The first semiconductor chip 23 is provided on the conductive pattern 22.

The first semiconductor chip 23 is formed by using a SiC substrate. The first switching device $SW1_1$ is a vertical n-channel MOSFET.

The gate electrode $GE1_1$ and the source electrode $SE1_1$ are provided on a front surface of the first semiconductor chip 23. The drain electrode $DE1_1$ is provided on a back surface of the first semiconductor chip 23 (not illustrated). The gate electrode $GE1_1$, the source electrode $SE1_1$, and the drain electrode $DE1_1$ of the first semiconductor chip 23 are electrodes of the first switching device $SW1_1$ that is a MOSFET.

The second semiconductor chip 24 is provided with the second switching device SW2. The second semiconductor chip 24 is provided on the conductive pattern 22.

The second semiconductor chip 24 is formed by using a Si substrate. The second switching device SW2 is a vertical n-channel MOSFET.

The gate electrode GE2, the source electrode SE2, a sensing electrode CSE, and the resistor R are provided on a front surface of the second semiconductor chip 24. The source electrode SE2 is coupled to the sensing electrode CSE via the resistor R on the front surface of the second semiconductor chip 24. The drain electrode DE2 is provided on a back surface of the second semiconductor chip 24 (not illustrated). The gate electrode GE2, the source electrode SE2, and the drain electrode DE2 of the second semiconductor chip 24 are electrodes of the second switching device SW2 that is a MOSFET.

The gate terminal GT, the source terminal ST, the drain terminal DT, the terminal SS, and the sensing terminal CS each have one end extending out from the semiconductor module 2. These terminals are made of, for example, copper, aluminum, or alloy including them. The gate terminal GT, the terminal SS, and the sensing terminal CS are electrically coupled to the not-illustrated drive circuit. The source terminal ST is grounded. The drain terminal DT is coupled to the power supply.

The following describes relationships of coupling among the aforementioned multiple electrodes and terminals in the semiconductor module 2.

The gate terminal GT is coupled to the gate electrode GE2 of the second semiconductor chip 24 via a wire. The gate electrode GE2 is coupled to the gate electrode GE1₁ of the first semiconductor chip 23 via a wire. The sensing terminal CS is coupled to the source electrode SE2 of the second semiconductor chip 24 via a wire. The source electrode SE2 is coupled to the sensing electrode CSE via the resistor R. The terminal SS is coupled to the sensing electrode CSE of the second semiconductor chip 24 via a wire. The sensing electrode CSE is coupled to the source electrode SE1₁ of the first semiconductor chip 23 via a wire.

The drain terminal DT is coupled to the conductive pattern 22 via a wire. The conductive pattern 22 is joined to the drain electrode DE1₁ of the first semiconductor chip 23 and the drain electrode DE2 of the second semiconductor chip 24 via a joining material such as solder. The source terminal ST is coupled to the source electrode SE1₁ of the first semiconductor chip 23 via a wire.

Incidentally, the first semiconductor chip 23 and the second semiconductor chip 24 are arranged such that a distance from the gate terminal GT to the gate electrode GE2 of the second switching device SW2 is smaller than a distance from the gate terminal GT to the gate electrode GE1₁ of the first switching device SW1₁. With this arrangement, the inductance and resistance value of the wire from the gate terminal GT to the gate electrode GE2 result in being smaller than the inductance and resistance value of the wire from the gate terminal GT to the gate electrode GE1₁. This makes it possible to reliably turn on the second switching device SW2 before the turning-on of the first switching device SW1₁.

The case 25 is made of resin or the like, and houses the insulating plate 21, the conductive pattern 22, the first semiconductor chip 23, and the second semiconductor chip 24. The case 25 according to an embodiment of the present disclosure is a substantially-rectangular box-shaped member having an opening on a front surface in a top view illustrated in FIG. 2. In the case 25 according to an embodiment of the present disclosure, the drain terminal DT and the source terminal ST extend out from one side surface of the case 25. Moreover, in the case 25, the gate terminal GT, the sensing terminal CS, and the terminal SS extend out from another side surface on the side opposite to the one side surface.

The first semiconductor chip 23 is arranged such that a distance from the first semiconductor chip 23 to the one side surface is smaller than a distance from the second semiconductor chip 24 to the one side surface. The second semiconductor chip 24 is arranged such that a distance from the second semiconductor chip 24 to the other side surface is smaller than a distance from the first semiconductor chip 23 to the other side surface.

With the electronic circuit 1 or the semiconductor module 2 having such a configuration as described above, it is possible to reduce the size of the first switching device SW1₁ that uses the semiconductor with the first band gap which is a costly material. This can provide a technique capable of sensing a current flowing through a switching device with a low-cost configuration.

Second Embodiment

<Electronic Circuit>

Figure 3:
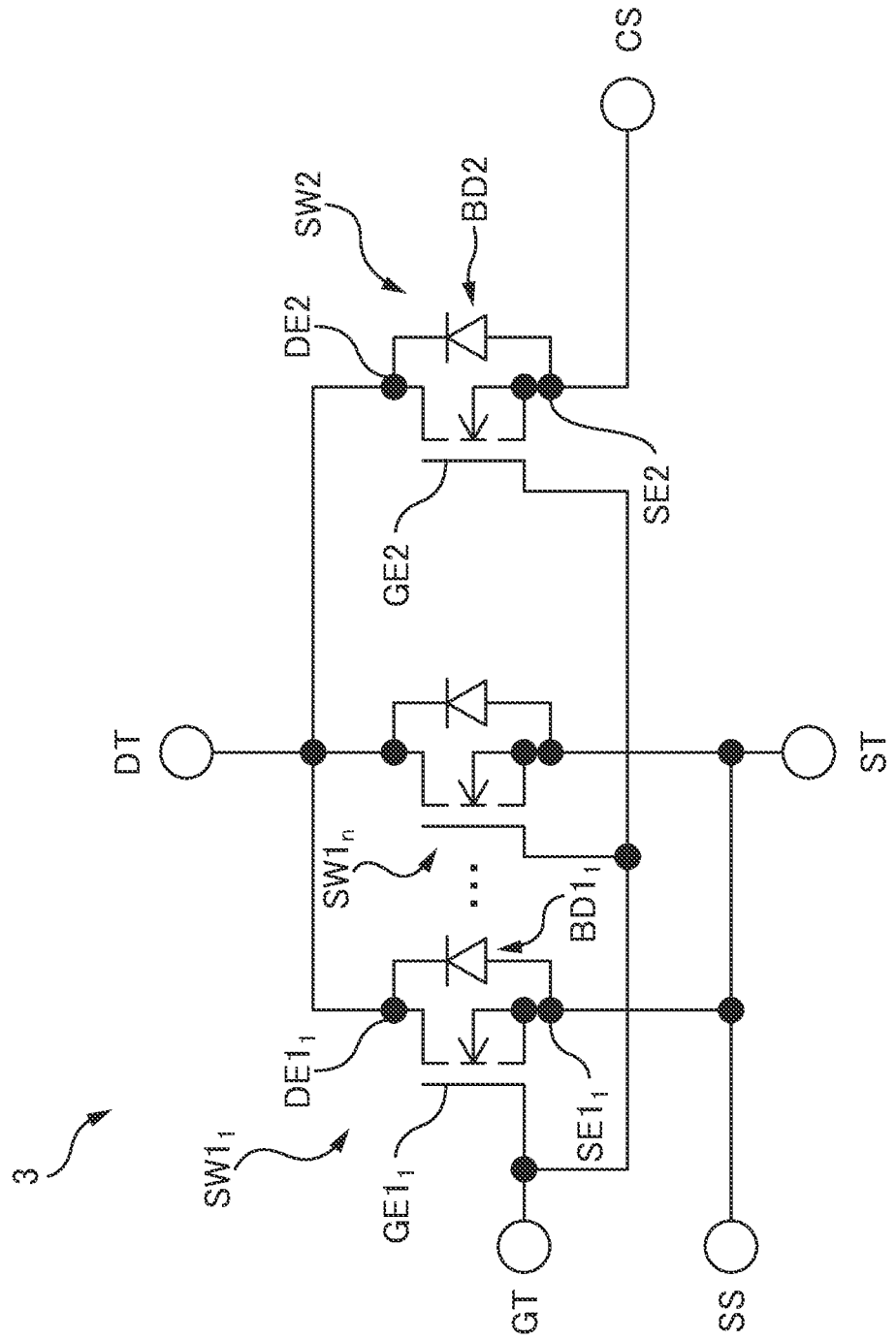
FIG. 3 is a diagram illustrating an example of an electronic circuit 3.

FIG. 3 is a diagram illustrating an example of an electronic circuit 3 according to an embodiment of the present disclosure. The electronic circuit 3 is different from the electronic circuit 1 according to the first embodiment in that the electronic circuit 3 includes no resistor R. The electronic circuit 3 can achieve such functions of overvoltage detection and overcurrent detection as described in the first embodiment by coupling a separately-provided external resistor $R_{ex}$ (not illustrated) between the terminal SS and the sensing terminal CS.

<Semiconductor Module>

Figure 4:
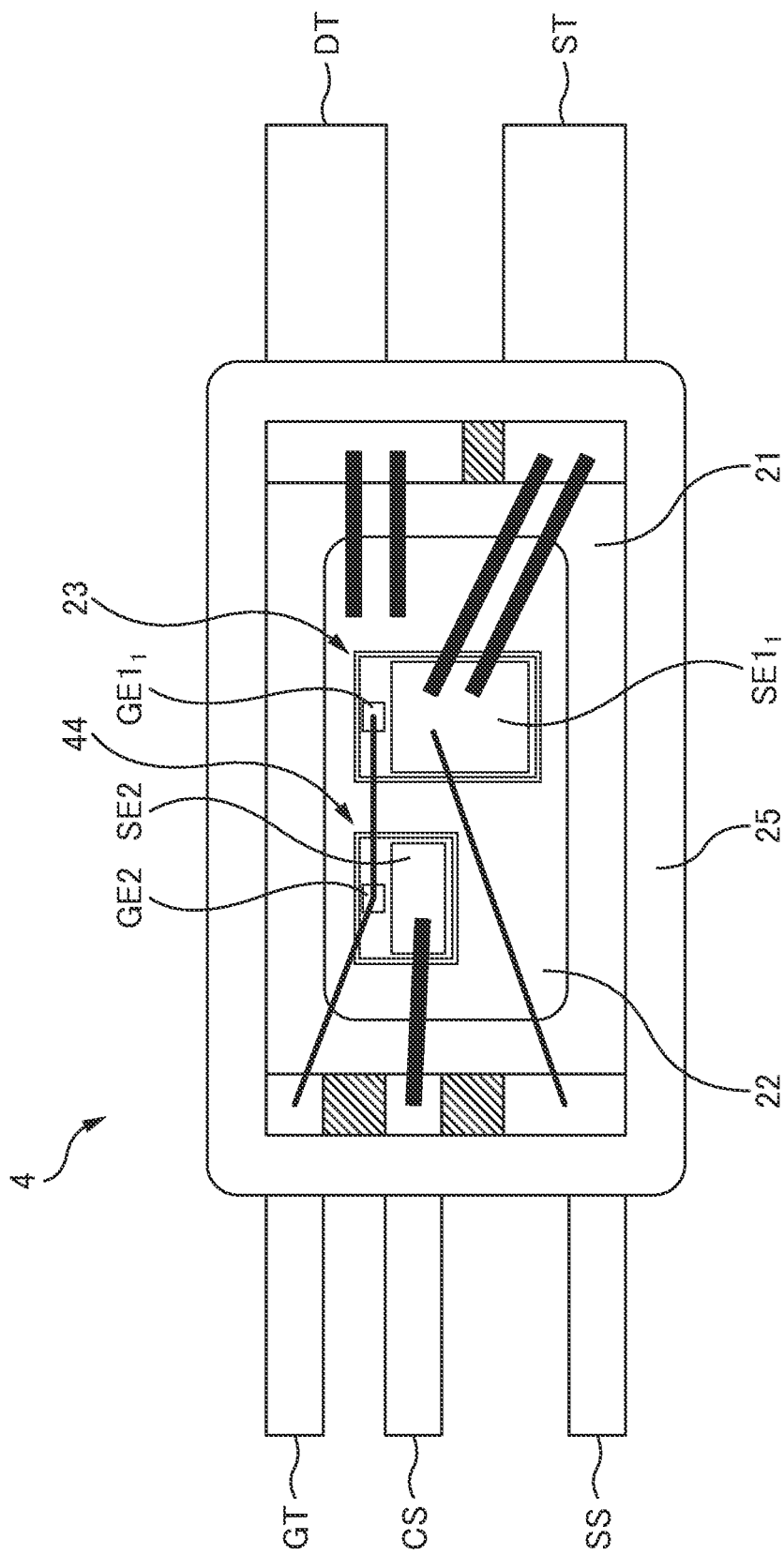
FIG. 4 is a diagram illustrating an example of a configuration of a semiconductor module 4.

FIG. 4 is a diagram illustrating an example of a configuration of a semiconductor module 4 according to an embodiment of the present disclosure. Note that, although FIG. 3 illustrates an aspect in which the electronic circuit 3 includes the n first switching devices SW1₁ to SW1ₙ, FIG. 4 illustrates an aspect in which the semiconductor module 4 includes a single first switching device SW1₁. The semiconductor module 4 according to an embodiment of the present disclosure is different from the semiconductor module 2 according to the first embodiment, in a configuration of a second semiconductor chip 44.

The second semiconductor chip 44 is formed using a Si substrate. The first switching device SW1₁ is a vertical n-channel MOSFET. The second semiconductor chip 44 is different from the second semiconductor chip 24 according to the first embodiment, in that the second semiconductor chip 44 is provided with no sensing electrode CSE or resistor R.

The gate electrode GE2 and the source electrode SE2 are provided on the front surface side of the second semiconductor chip 44. The drain electrode DE2 is provided on the back surface side of the second semiconductor chip 44 (not illustrated). The gate electrode GE2, the source electrode SE2, and the drain electrode DE2 of the second semiconductor chip 44 are electrodes of the second switching device SW2 that is a MOSFET.

The semiconductor module 4 can achieve such functions of overvoltage detection and overcurrent detection as described in the first embodiment by coupling the separately-prepared external resistor $R_{ex}$ (not illustrated) between the terminal SS and the sensing terminal CS extending out from the semiconductor module 4.

Third Embodiment

<Electronic Circuit>

Figure 5:
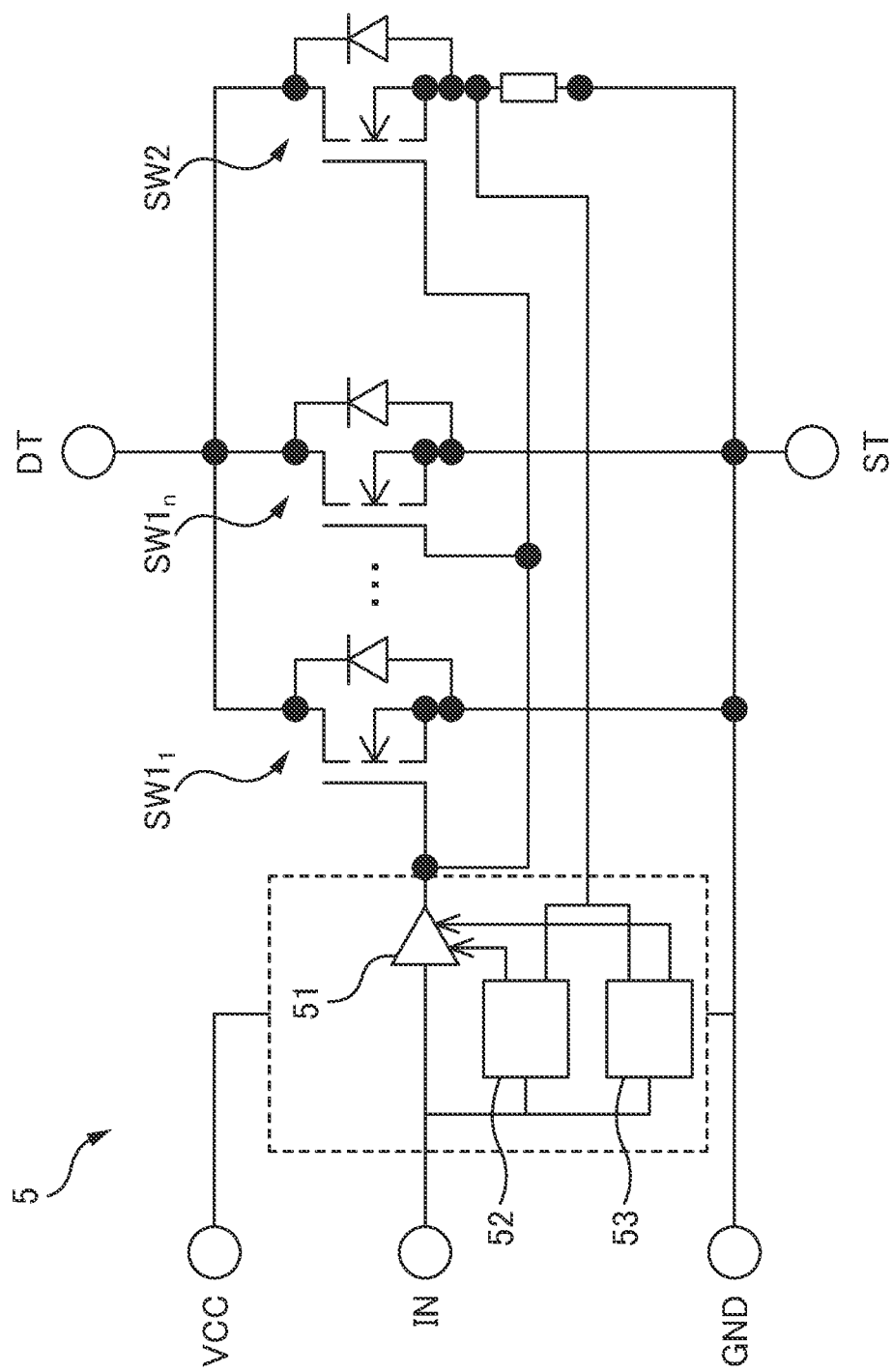
FIG. 5 is a diagram illustrating an example of an electronic circuit 5.
Figure 6:
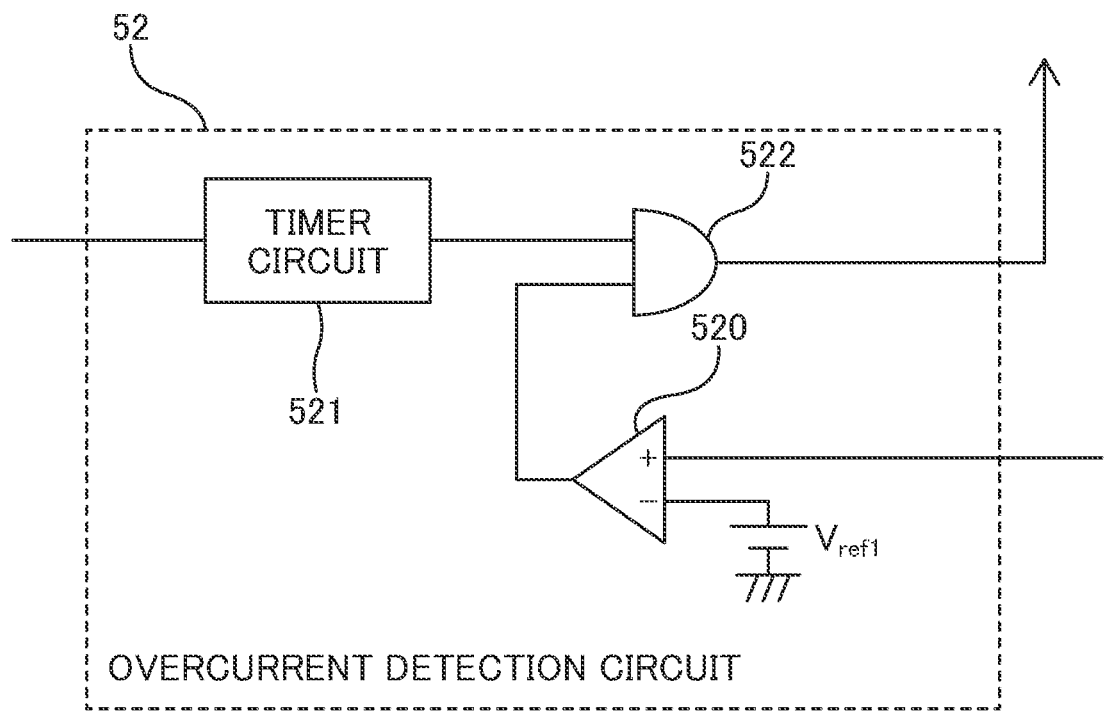
FIG. 6 is a diagram illustrating an example of an overcurrent detection circuit 52.
Figure 7:
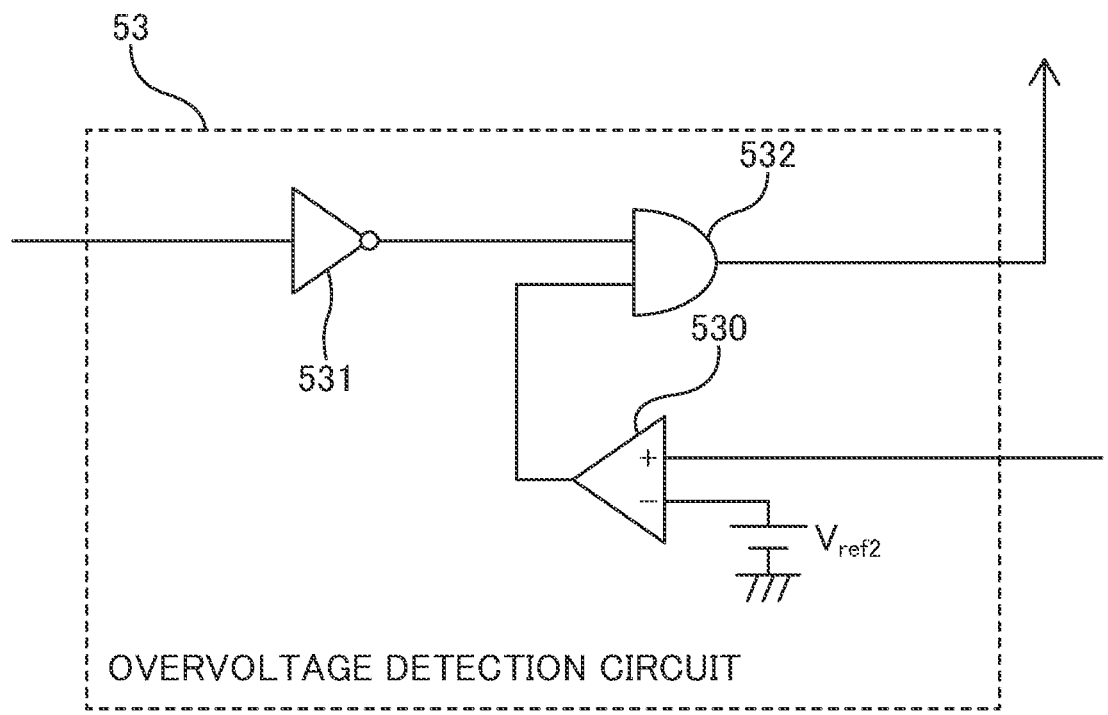
FIG. 7 is a diagram illustrating an example of an overvoltage detection circuit 53.

FIGS. 5 to 7 are diagrams illustrating an example of an electronic circuit 5 according to an embodiment of the present disclosure. The electronic circuit 5 is different from the electronic circuit 1 according to the first embodiment, in that the electronic circuit 5 includes a drive circuit 51, an overcurrent detection circuit 52, and an overvoltage detection circuit 53. Moreover, the electronic circuit 5 is different from the electronic circuit 1 according to the first embodiment, in that the electronic circuit 5 includes a power supply terminal VCC, an input terminal IN, and a ground terminal GND.

The drive circuit 51 outputs the drive signal for driving the first switching device SW1 and the second switching device SW2 to the gate electrode GE1 of the first switching device SW1 and the gate electrode GE2 of the second switching device SW2. The input side of the drive circuit 51 is coupled to the input terminal IN and the output side of the drive circuit 51 is coupled to the gate electrode GE1 of the first switching device SW1 and the gate electrode GE2 of the second switching device SW2.

FIG. 6 is a diagram illustrating details of the overcurrent detection circuit 52. The overcurrent detection circuit 52 detects whether an overcurrent is flowing through the first switching device SW1 based on the voltage at the source electrode SE2 of the second switching device SW2. Here, the voltage at the source electrode SE2 of the second switching device SW2 is a voltage when a predetermined time period has elapsed from the output of the drive signal for turning on the first switching device SW1 and the second switching device SW2.

Here, the drive signal for turning on the first switching device SW1 and the second switching device SW2 is a high signal. Moreover, a drive signal for turning off the first switching device SW1 and the second switching device SW2 is a low signal. Furthermore, the "predetermined time" is the time interval $t_m$ described in the first embodiment. The overcurrent detection circuit 52 according to an embodiment of the present disclosure includes a comparator circuit 520, a timer circuit 521, and an AND circuit 522.

The comparator circuit 520 has a positive input terminal coupled to the source electrode SE2 of the second switching device SW2, a negative input terminal coupled to the first reference voltage $V_{ref1}$, and an output terminal coupled to one input terminal of the AND circuit 522. In other words, the comparator circuit 520 switches an output to high in response to the voltage at the source electrode SE2 of the second switching device SW2 exceeding the first reference voltage $V_{ref1}$.

The timer circuit 521 measures a time period from the output of the drive signal for turning on the first switching device SW1 and the second switching device SW2. The timer circuit 521 switches an output to high when the measured time period exceeds the time interval $t_m$. The input side of the timer circuit 521 is coupled to the input terminal IN, and the output side of the timer circuit 521 is coupled to the other input side of the AND circuit 522.

One input side of the AND circuit 522 is coupled to the output side of the comparator circuit 520, the other input side thereof is coupled to the output of the timer circuit 521, and the output side thereof is coupled to the drive circuit 51. In other words, the AND circuit 522 switches an output to high in response to the time period from the output of the drive signal for turning on the first switching device SW1 and the second switching device SW2 exceeding the time interval $t_m$ as well as the voltage at the source electrode SE2 of the second switching device SW2 exceeding the first reference voltage $V_{ref1}$. This state indicates that an overcurrent is detected.

FIG. 7 is a diagram illustrating details of the overvoltage detection circuit 53. The overvoltage detection circuit 53 detects whether an overvoltage is applied to the first switching device SW1 based on the voltage at the source electrode SE2 of the second switching device SW2. Here, the voltage at the source electrode SE2 of the second switching device SW2 is a voltage when the drive signal for turning off the first switching device SW1 and the second switching device SW2 is outputted. The overvoltage detection circuit 53 according to an embodiment of the present disclosure includes a comparator circuit 530, a NOT circuit 531, and an AND circuit 532.

The positive input side of the comparator circuit 530 is coupled to the source electrode SE2 of the second switching device SW2, the negative input side thereof is coupled to the second reference voltage $V_{ref2}$, and the output side thereof is coupled to one input of the AND circuit 532. In other words, the comparator circuit 530 switches an output to high in response to the voltage at the source electrode SE2 of the second switching device SW2 exceeding the second reference voltage $V_{ref2}$.

The input side of the NOT circuit 531 is coupled to the input terminal IN and the output side thereof is coupled to the other input of the AND circuit 532. The NOT circuit 531 receives a low input and outputs a high output.

The one input side of the AND circuit 532 is coupled to the output of the comparator circuit 530, the other input coupled to the output of the NOT circuit 531, and the output side thereof is coupled to the drive circuit 51.

In other words, the AND circuit 532 switches an output to high in response to the voltage at the source electrode SE2 of the second switching device SW2 exceeding the second reference voltage $V_{ref2}$. This state indicates that an overvoltage is detected.

The drive circuit 51, the overcurrent detection circuit 52, and the overvoltage detection circuit 53 operate by being supplied with a power supply voltage applied to the power supply terminal VCC.

With the electronic circuit 5 having such a circuit configuration described above, it is possible to detect an overcurrent or overvoltage. Moreover, upon detecting an overcurrent or overvoltage, the drive circuit 51 stops driving the first switching device SW1 and the second switching device SW2, for example. This protects the electronic circuit 5 from an overcurrent or overvoltage. Note that the operation of the drive circuit 51 is stopped upon detecting an overcurrent or overvoltage in an embodiment of the present disclosure, however, a detection result may be outputted to a microcomputer (not illustrated) that controls the electronic circuit 5.

<Semiconductor Module>

Figure 8:
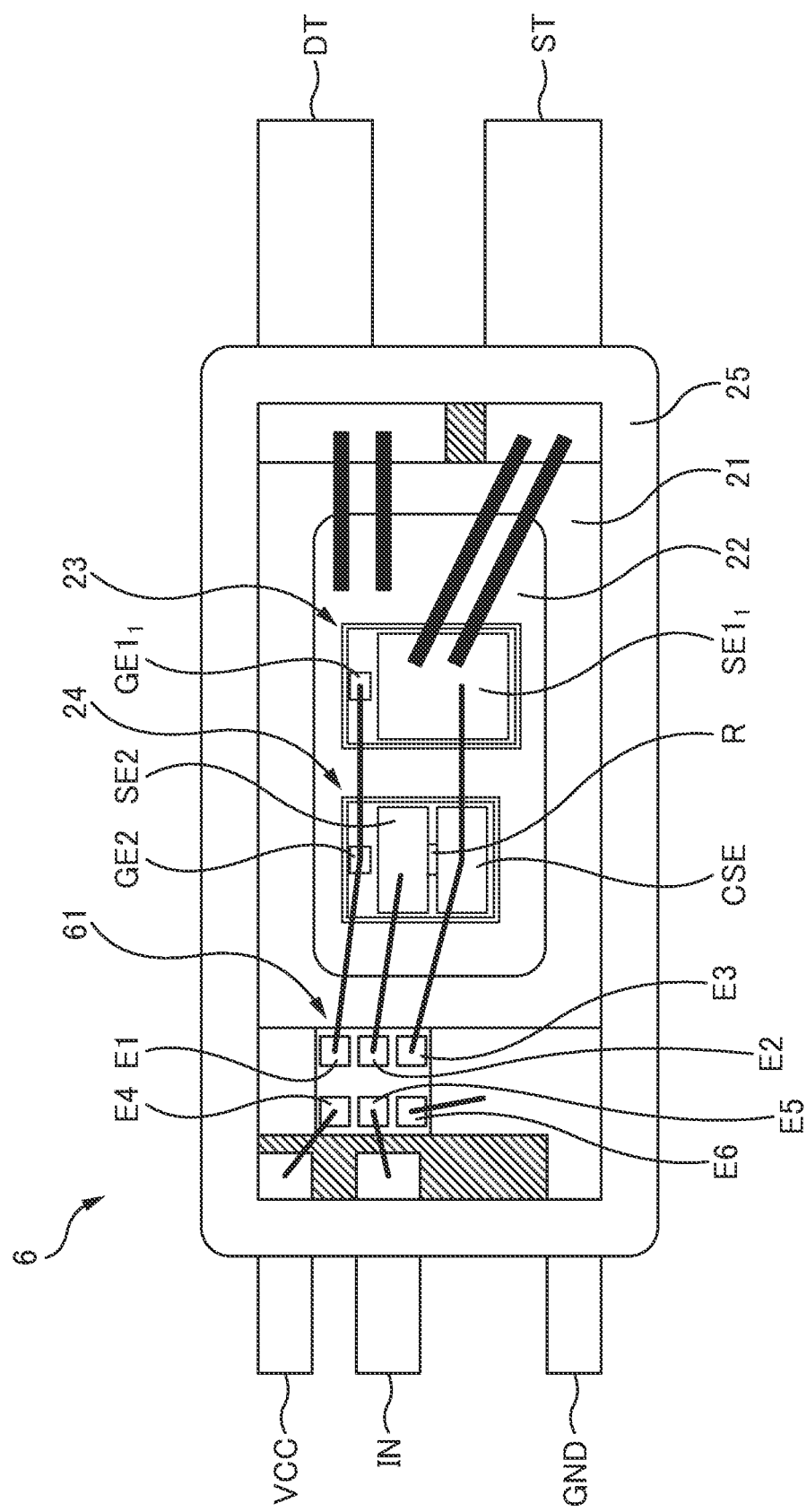
FIG. 8 is a diagram illustrating an example of a configuration of a semiconductor module 6.

FIG. 8 is a diagram illustrating an example of a configuration of a semiconductor module 6 according to an embodiment of the present disclosure. The semiconductor module is a semiconductor module including the aforementioned electronic circuit 5. The semiconductor module 6 according to an embodiment of the present disclosure is different from the semiconductor module 2 according to the first embodiment, in that the semiconductor module 6 includes a third semiconductor chip 61.

The third semiconductor chip 61 is provided with the drive circuit 51, the overcurrent detection circuit 52, and the overvoltage detection circuit 53. The third semiconductor chip 61 has six electrodes E1 to E6.

The electrode E1 is an electrode for coupling to the output side of the drive circuit 51. The electrode E2 is an electrode for coupling to the positive input side of the comparator circuit 520 and the positive input side of the comparator circuit 530. The electrode E3 is an electrode for supplying the ground voltage. The electrode E4 is an electrode for supplying the power supply voltage to the electronic circuit 5. The electrode E5 is an electrode for supplying an input signal to the drive circuit 51. The electrode E6 is an electrode for coupling to the ground terminal GND.

The power supply terminal VCC is coupled to the electrode E4 via a wire. The input terminal IN is coupled to the electrode E5 via a wire. The ground terminal GND is coupled to the electrode E6 via a wire. The drain terminal DT is coupled to the conductive pattern 22 via a wire. The conductive pattern is joined to the drain electrode $DE1_1$ of the first semiconductor chip 23 and the drain electrode DE2 of the second semiconductor chip 24 via a joining member such as solder.

The source terminal ST is coupled to the source electrode $SE1_1$ of the first semiconductor chip 23 via a wire. The source electrode $SE1_1$ is coupled to the sensing electrode CSE of the second semiconductor chip 24 via a wire. The sensing electrode CSE is coupled to the electrode E3 via a wire. The sensing electrode CSE is also coupled to the source electrode SE2 of the second semiconductor chip 24 via the resistor R. The source electrode SE2 is coupled to the electrode E2 via a wire.

The electrode E1 is coupled to the gate electrode GE2 of the second semiconductor chip 24 via a wire. The gate electrode GE2 is coupled to the gate electrode GE1₁ of the first semiconductor chip 23 via a wire.

In the case 25 according to an embodiment of the present disclosure, the drain terminal DT and the source terminal ST extend out from one side surface of the case 25. Moreover, in the case 25, the power supply terminal VCC, the input terminal IN, and the ground terminal GND extend out from another side surface on the side opposite to the one side surface.

The first semiconductor chip 23 is arranged such that a distance from the first semiconductor chip 23 to the one side surface is smaller than a distance from the second semiconductor chip 24 to the one side surface. The second semiconductor chip 24 is arranged such that a distance from the second semiconductor chip 24 to the third semiconductor chip 61 is smaller than a distance from the first semiconductor chip 23 to the third semiconductor chip 61.

The semiconductor module 2 according to the first embodiment includes no drive circuit that controls the first switching device SW1₁ and the second switching device SW2. In such a case, the first semiconductor chip 23 and the second semiconductor chip 24 are arranged such that a distance from the gate terminal GT to the gate electrode GE2 of the second switching device SW2 is smaller than a distance from the gate terminal GT to the gate electrode GE1₁ of the first switching device SW1₁.

Meanwhile, when the semiconductor module 6 includes the drive circuit 51 that controls the first switching device SW1₁ and the second switching device SW2 as in an embodiment of the present disclosure, the "gate terminal GT" in the first embodiment corresponds to the "electrode E1 of the drive circuit 51" in terms of the arrangement of the first semiconductor chip 23 and the second semiconductor chip 24. As described above, the electrode E1 is the electrode from which the drive circuit 51 outputs the signal for controlling the first switching device SW1₁ and the second switching device SW2.

In other words, the first semiconductor chip 23 and the second semiconductor chip 24 are arranged such that a distance from the electrode E1 to the gate electrode GE2 of the second switching device SW2 is smaller than a distance from the electrode E1 to the gate electrode GE1₁ of the first switching device SW1₁.

This makes it possible to reliably turn on the second switching device SW2 before the turning-on of the first switching device SW1₁.

Fourth Embodiment

<Electronic Circuit>

Figure 9:
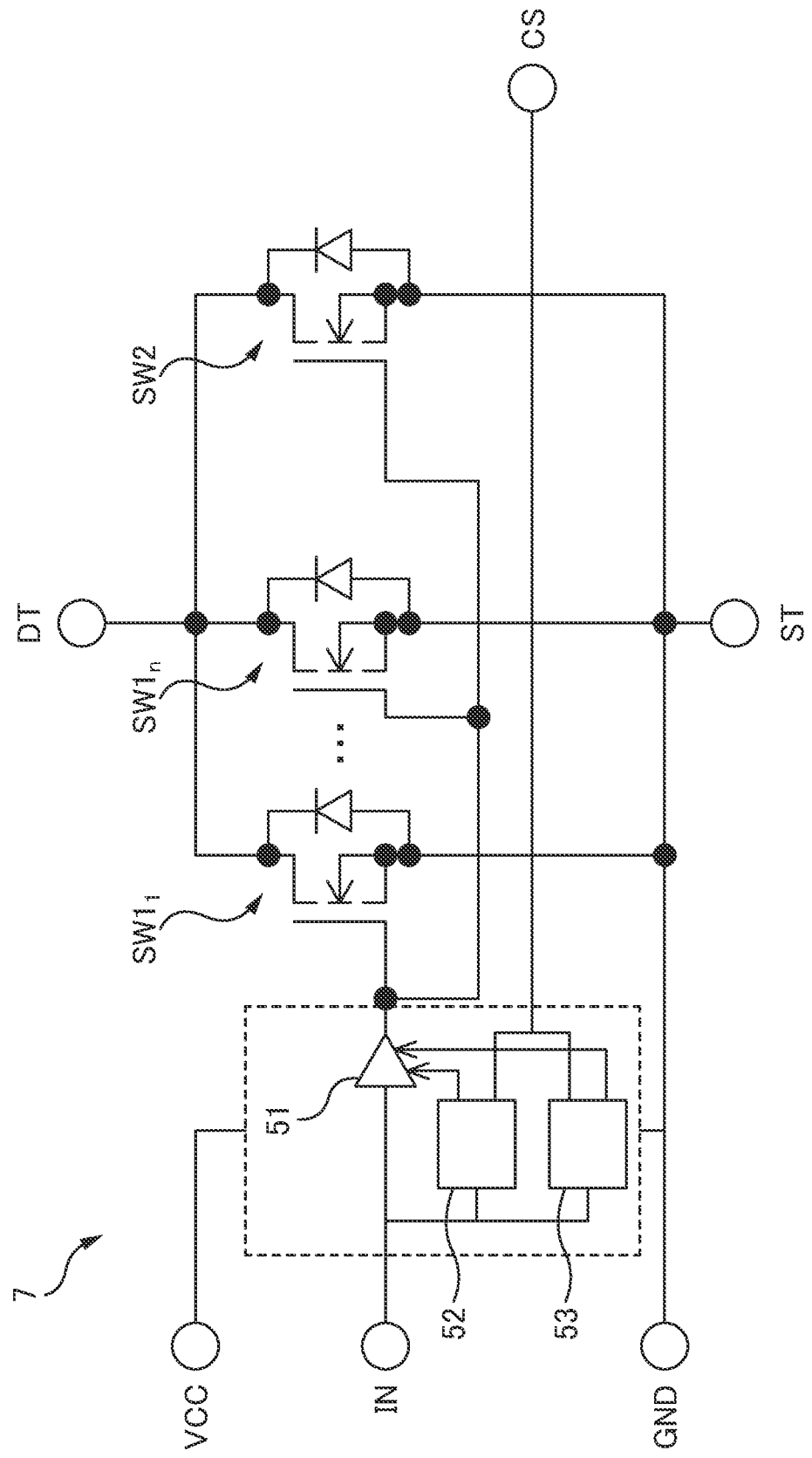
FIG. 9 is a diagram illustrating an example of an electronic circuit 7.

FIG. 9 is a diagram illustrating an example of an electronic circuit 7 according to an embodiment of the present disclosure. The electronic circuit 7 is different from the electronic circuit 5 according to the third embodiment, in that the electronic circuit 7 includes no resistor R. The electronic circuit 7 can achieve such functions of overvoltage detection and overcurrent detection as described in the first embodiment by coupling the separately-prepared external resistor $R_{ex}$ (not illustrated) between the sensing terminal CS and the ground terminal GND.

<Semiconductor Module>

Figure 10:
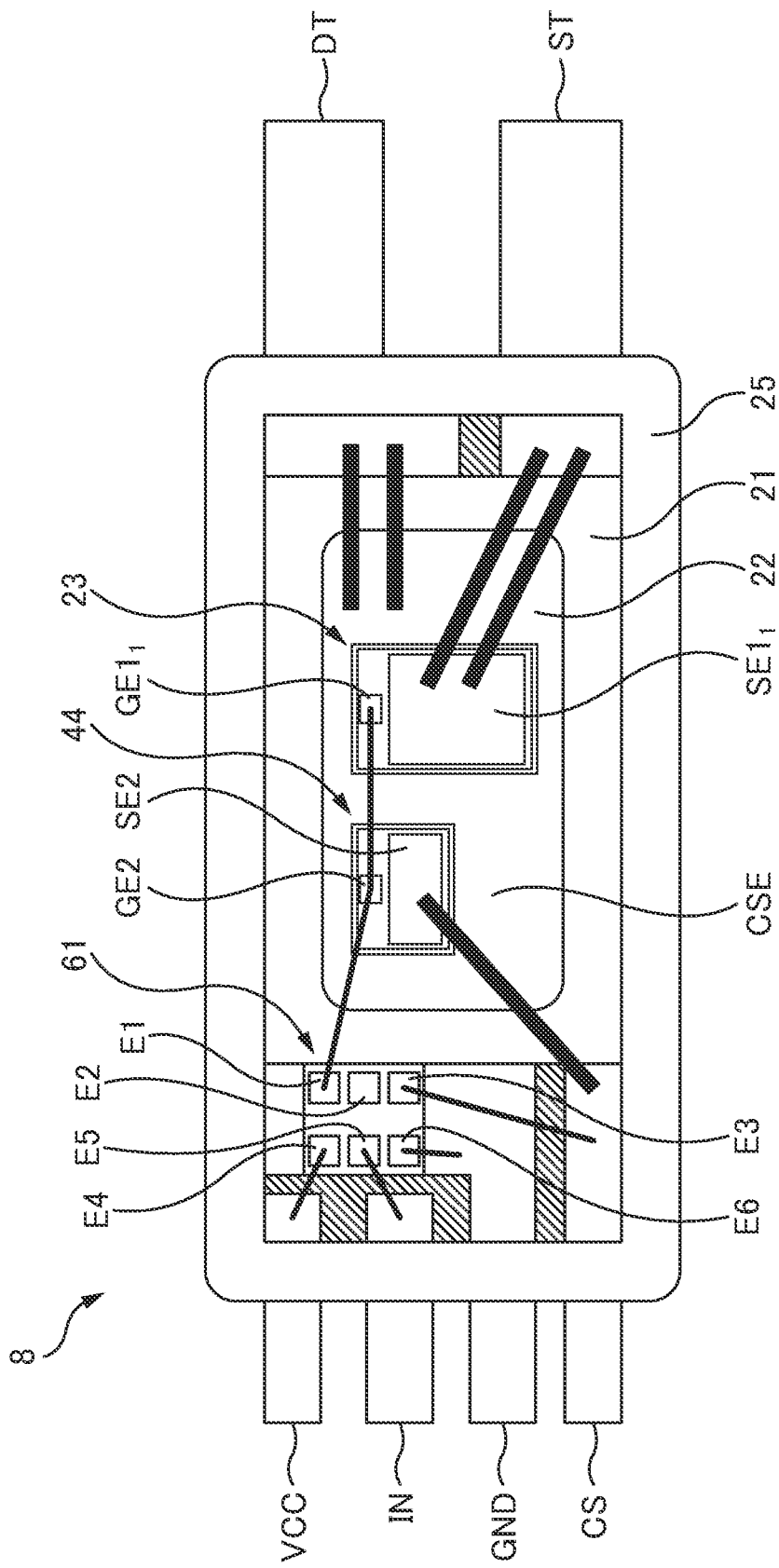
FIG. 10 is a diagram illustrating an example of a configuration of a semiconductor module 8.

FIG. 10 is a diagram illustrating an example of a configuration of a semiconductor module 8 according to an embodiment of the present disclosure. The semiconductor module 8 according to an embodiment of the present disclosure is different from the semiconductor module 6 according to the third embodiment, in the configuration of the second semiconductor chip 44. The second semiconductor chip according to an embodiment of the present disclosure has the same configuration as that of the second semiconductor chip 44 in the second embodiment.

The semiconductor module 8 can achieve such functions of overvoltage detection and overcurrent detection as described in the first embodiment by coupling the separately-prepared external resistor $R_{ex}$ (not illustrated) between the terminal SS and the ground terminal GND extending out from the semiconductor module 8.

SUMMARY

Hereinabove, the electronic circuits 1, 3, 5, and 7 according to the first to fourth embodiments each are the electronic circuit that includes: the first switching device SW1 that uses the semiconductor with the first band gap; and the second switching device SW2 that is coupled in parallel to the first switching device SW1 and uses the semiconductor with the second band gap smaller than the first band gap, wherein the first switching device SW1 has the control electrode coupled to the control electrode of the second switching device SW2.

This can reduce the size of the first switching device SW1 that uses the semiconductor with the first band gap which is a costly material. Accordingly, it is possible to provide an electronic circuit capable of sensing a current flowing through a switching device with a low-cost configuration.

Moreover, in the aforementioned electronic circuits 1, 3, 5, and 7, the threshold voltage of the first switching device SW1 is equal to or higher than the threshold voltage of the second switching device SW2. This causes the second switching device SW2 to be turned on before the turning-on of the first switching device SW1, in response to the output of the drive signal for turning on the first switching device SW1 and the second switching device SW2. Hence, it is possible to avoid such an issue that the current flowing through the first switching device SW1 cannot be detected because the second switching device SW2 is off while the first switching device SW1 is on.

Furthermore, in the aforementioned electronic circuits 1, 3, 5, and 7, the withstand voltage of the first switching device SW1 is higher than the withstand voltage of the second switching device SW2. This makes it possible to detect an overvoltage applied to the first switching device SW1 by detecting the current due to the avalanche breakdown occurring in the second switching device SW2 when the first switching device SW1 and the second switching device SW2 are off.

Moreover, the electronic circuits 1 and 5 according to the first and third embodiments each further include the resistor R, the resistor R having one end coupled to the ground-side electrode of the first switching device SW1 and the other end coupled to the ground-side electrode of the second switching device SW2. The current flowing through the first switching device SW1 can be detected based on the voltage across the resistor R.

Furthermore, the electronic circuits 5 and 7 according to the third and fourth embodiments each further include: the drive circuit 51 configured to output the drive signal for driving the first switching device SW1 and the second switching device SW2 to the control electrode of the first switching device SW1 and the control electrode of the second switching device SW2; and the overcurrent detection circuit 52 configured to detect whether an overcurrent is flowing through the first switching device SW1, based on the voltage at the ground-side electrode of the second switching device SW2 at a time when the predetermined time period has elapsed from the output of the drive signal for turning on the first switching device SW1 and the second switching device SW2. This makes it possible to use the drive circuit 51 and the overcurrent detection circuit 52 according to the performance of the first semiconductor chip 23.

Moreover, the electronic circuits 5 and 7 according to the third and fourth embodiments each further include the overvoltage detection circuit 53 configured to detect whether an overvoltage is applied to the first switching device SW1, based on the voltage at the ground-side electrode of the second switching device SW2 in the state where the drive signal for turning off the first switching device SW1 and the second switching device SW2 is outputted. This makes it possible to use the overvoltage detection circuit 53 according to the performance of the first semiconductor chip 23.

Furthermore, in the electronic circuits 1, 3, 5, and 7 according to the first to fourth embodiments, the semiconductor with the first band gap is SiC, and the semiconductor with the second band gap is Si. This can reduce the size of the first switching device SW1 that uses SiC which is a costly material. Accordingly, it is possible to provide an electronic circuit that can sense a current flowing through a switching device with a low-cost configuration.

Moreover, in the electronic circuits 1, 3, 5, and 7 according to the first to fourth embodiments, the first switching device SW1 and the second switching device SW2 are MOSFETs. This enables omission of freewheeling diodes that are to be provided to the first switching device SW1 and the second switching device SW2. Moreover, since the current voltage characteristics in an on-state is linear, design accuracy for handling a short circuit current is improved.

The semiconductor modules 2, 4, 6, and 8 according to the first to fourth embodiments are semiconductor modules including the electronic circuits 1, 3, 5, and 7 according to the first to fourth embodiments, respectively. This can reduce the size of the first switching device SW1 that uses the semiconductor with the first band gap which is a costly material. Accordingly, it is possible to provide a semiconductor module that can sense a current flowing through a switching device with a low-cost configuration.

The semiconductor modules 2 and 4 according to the first and second embodiments each include: the first semiconductor chip 23 provided with the first switching device SW1; the second semiconductor chip 24 or 44 provided with the second switching device SW2; and the gate terminal GT from which the signal for controlling the first switching device SW1 and the second switching device SW2 is outputted, wherein the first semiconductor chip 23 and the second semiconductor chip 24 or 44 are arranged such that the distance from the gate terminal GT to the control electrode of the second switching device SW2 is smaller than the distance from the gate terminal GT to the control electrode of the first switching device SW1. Here, the signal for controlling the first switching device SW1 and the second switching device SW2 is outputted, to the gate terminal GT, from the drive circuit outside the semiconductor module 2 or 4.

Note that, when the semiconductor module 6 or 8 includes the drive circuit 51 configured to control the first switching device $SW1_1$ and the second switching device SW2 as in the third and fourth embodiment, the "gate terminal GT" in this configuration corresponds to the "electrode E1 of the drive circuit 51". The electrode E1 is an electrode from which the drive circuit 51 outputs the signal for controlling the first switching device $SW1_1$ and the second switching device SW2.

This can prevent the first switching device SW1 from being turned on before the turning-on of the second switching device SW2, in response to the output of the drive signal for turning on the first switching device SW1 and the second switching device SW2. Hence, it is possible to prevent such an issue that the current flowing through the first switching device SW1 cannot be detected because the second switching device SW2 is off while the first switching device SW1 is on.

The semiconductor modules 2 and 4 according to the first and second embodiments include the electronic circuits 1 and 3 according to the first and second embodiments, respectively, and each include: the first semiconductor chip 23 provided with the first switching device SW1; the second semiconductor chip 24 provided with the second switching device SW2; the case 25 housing the first semiconductor chip 23 and the second semiconductor chip 24; the source terminal ST coupled to the ground-side electrode of the first switching device SW1; the drain terminal DT coupled to the power-supply-side electrode of the first switching device SW1; the gate terminal GT coupled to the control electrodes of the first switching device SW1 and the second switching device SW2; the sensing terminal CS coupled to the ground-side electrode of the second switching device SW2; and the terminal SS coupled to the ground-side electrode of the first switching device SW1, wherein the source terminal ST and the drain terminal DT extend out from one side-surface of the case 25, the gate terminal GT, the sensing terminal CS, and the terminal SS extend out from another side-surface of the case on the side opposite to the one side-surface, the first semiconductor chip 23 is arranged such that the distance from the first semiconductor chip 23 to the one side-surface is smaller than the distance from the second semiconductor chip 24 to the one side-surface, and the second semiconductor chip 24 is arranged such that the distance from the second semiconductor chip 24 to the other side-surface is smaller than the distance from the first semiconductor chip 23 to the other side-surface.

This can prevent the first switching device SW1 from being turned on before the turning-on of the second switching device SW2, in response to the output of the drive signal for turning on the first switching device SW1 and the second switching device SW2. Accordingly, it is possible to prevent such an issue that the current flowing through the first switching device SW1 cannot be detected because the second switching device SW2 is off while the first switching device SW1 is on.

The semiconductor modules 2 and 6 according to the first and third embodiments include the electronic circuits 1 and 5 according to the first and third embodiments, respectively, and each include: the first semiconductor chip 23 provided with the first switching device SW1; and the second semiconductor chip 24 provided with the second switching device SW2 and the resistor R.

Accordingly, this eliminates the need to provide the resistor R outside the semiconductor modules 2 and 6. Moreover, the configurations of the semiconductor modules 2 and 6 can be simplified.

The semiconductor modules 6 and 8 according to the third and fourth embodiments include the electronic circuits 5 and 7 according to the third and fourth embodiments, respectively, and each include: the first semiconductor chip 23 provided with the first switching device SW1; the second semiconductor chip 24 provided with the second switching device SW2; and the third semiconductor chip 61 provided with the drive circuit 51. This makes it possible to use the drive circuit 51 according to the performance of the first semiconductor chip 23.

In the semiconductor modules 6 and 8 according to the third and fourth embodiments, the third semiconductor chip 61 is further provided with the overcurrent detection circuit 52. This makes it possible to use the overcurrent detection circuit 52 according to the performance of the first semiconductor chip 23.

The semiconductor modules 6 and 8 according to the third and fourth embodiments include the electronic circuits 5 and 7 according to the third and fourth embodiments, respectively, and each include: the first semiconductor chip 23 provided with the first switching device SW1, the second semiconductor chip 24 provided with the second switching device SW2, and the third semiconductor chip 61 provided with the drive circuit 51, the overcurrent detection circuit 52, and the overvoltage detection circuit 53. This makes it possible to use the drive circuit 51, the overcurrent detection circuit 52, and the overvoltage detection circuit 53 according to the performance of the first semiconductor chip 23.

The semiconductor modules 6 and 8 according to the third and fourth embodiments each further include: the case 25 housing the first semiconductor chip 23, the second semiconductor chip 24, and the third semiconductor chip 61; the source terminal ST coupled to the ground-side electrode of the first switching device SW1; the drain terminal DT coupled to the power-supply-side electrode of the first switching device SW1; the power supply terminal VCC for supplying the power supply voltage to the drive circuit 51; the input terminal IN coupled to the input side of the drive circuit 51; and the ground terminal GND coupled to the ground side of the drive circuit 51, wherein the source terminal ST and the drain terminal DT extend out from one side-surface of the case 25, the power supply terminal VCC, the input terminal IN, and the ground terminal GND extend out from another side-surface of the case 25 on the side opposite to the one side surface, the first semiconductor chip 23 is arranged such that the distance from the first semiconductor chip 23 to the one side-surface is smaller than the distance from the second semiconductor chip 24 to the one side-surface, and the second semiconductor chip 24 is arranged such that the distance from the second semiconductor chip 24 to the third semiconductor chip 61 is smaller than the distance from the first semiconductor chip 23 to the third semiconductor chip 61.

This can prevent the first switching device SW1 from being turned on before the turning-on of the second switching device SW2, in response to the output of the drive signal for turning on the first switching device SW1 and the second switching device SW2. Hence, it is possible to prevent such an issue that the current flowing through the first switching device SW1 cannot be detected because the second switching device SW2 is off while the first switching device SW1 is on and.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

According to the present disclosure, it is possible to provide a technique capable of sensing of a current flowing through a switching current with a low-cost configuration.

What is claimed is:

1. An electronic circuit, comprising:
   a first switching device that contains a first semiconductor material with a first band gap; and
   a second switching device that is coupled in parallel to the first switching device, and contains a second semiconductor material with a second band gap smaller than the first band gap, wherein
   each of the first and second switching devices has a control electrode, and the control electrode of the first switching device is coupled to the control electrode of the second switching device, wherein
   each of the first and second switching devices has a threshold voltage, and
   the threshold voltage of the first switching device is equal to or higher than the threshold voltage of the second switching device.

2. The electronic circuit according to claim 1, wherein
   each of the first and second switching devices has a withstand voltage, and
   the withstand voltage of the first switching device is higher than the withstand voltage of the second switching device.

3. The electronic circuit according to claim 1, wherein
   each of the first and second switching devices has a ground-side electrode, and
   the electronic circuit further comprises a resistor having two ends, one end thereof being coupled to the ground-side electrode of the first switching device, and the other end thereof being coupled to the ground-side electrode of the second switching device.

4. The electronic circuit according to claim 1, wherein
   the second switching device has a ground-side electrode, and
   the electronic circuit further comprises:
   a drive circuit configured to output a drive signal, for turning on and off the first switching device and the second switching device, to the control electrode of the first switching device and the control electrode of the second switching device, and
   an overcurrent detection circuit configured to detect whether an overcurrent is flowing through the first switching device, based on a voltage at the ground-side electrode of the second switching device at a time when a predetermined time period has elapsed since output of the drive signal for turning on the first switching device and the second switching device.

5. The electronic circuit according to claim 4, further comprising an overvoltage detection circuit configured to detect whether an overvoltage is applied to the first switching device, based on the voltage at the ground-side electrode of the second switching device when the drive signal for turning off the first switching device and the second switching device is outputted.

6. The electronic circuit according to claim 1, wherein
   the first semiconductor material is SiC, and
   the second semiconductor material is Si.

7. The electronic circuit according to claim 1, wherein each of the first switching device and the second switching device is a metal-oxide-semiconductor field-effect transistor (MOSFET).

8. A semiconductor module including the electronic circuit according to claim 1.

9. The semiconductor module according to claim 8, further comprising:

a first semiconductor chip including the first switching device, a second semiconductor chip including the second switching device, and a terminal from which a signal for controlling the first switching device and the second switching device is outputted, wherein the first semiconductor chip and the second semiconductor chip are arranged such that a distance from the terminal to the control electrode of the second switching device is smaller than a distance from the terminal to the control electrode of the first switching device.

10. A semiconductor module including the electronic circuit according to claim 1, the semiconductor module further comprising:

a first semiconductor chip including the first switching device, the first switching device further including a ground-side electrode and a power-supply-side electrode thereof;

a second semiconductor chip including the second switching device, the second switching device further including a ground-side electrode and a power-supply-side electrode thereof;

a case housing the first semiconductor chip and the second semiconductor chip, the case having a first side surface and a second side surface opposite to each other;

a source terminal coupled to the ground-side electrode of the first switching device;

a drain terminal coupled to the power-supply-side electrode of the first switching device;

a gate terminal coupled to the control electrodes of the first switching device and the second switching device;

a sensing terminal coupled to the ground-side electrode of the second switching device; and a driving terminal coupled to the ground-side electrode of the first switching device, wherein the source terminal and the drain terminal extend out from the first side surface of the case, the gate terminal, the sensing terminal, and the driving terminal extend out from the second side surface of the case, the first semiconductor chip is arranged such that a distance from the first semiconductor chip to the first side surface is smaller than a distance from the second semiconductor chip to the first side surface, and the second semiconductor chip is arranged such that a distance from the second semiconductor chip to the second side surface is smaller than a distance from the first semiconductor chip to the second side surface.

11. A semiconductor module including the electronic circuit according to claim 3, the semiconductor module further comprising:

a first semiconductor chip including the first switching device; and a second semiconductor chip including the second switching device and the resistor.

12. A semiconductor module including the electronic circuit according to claim 4, the semiconductor module further comprising:

a first semiconductor chip including the first switching device;

a second semiconductor chip including the second switching device; and a third semiconductor chip including the drive circuit.

13. The semiconductor module according to claim 12, wherein the third semiconductor chip further includes the overcurrent detection circuit.

14. A semiconductor module including the electronic circuit according to claim 5, the semiconductor module further comprising:

a first semiconductor chip including the first switching device;

a second semiconductor chip including the second switching device; and a third semiconductor chip including the drive circuit, the overcurrent detection circuit, and the overvoltage detection circuit.

15. The semiconductor module according to claim 12, wherein the first switching device further including a ground-side electrode and a power-supply-side electrode thereof;

the second switching device further including a power-supply-side electrode thereof; and the semiconductor module further comprises:

a case housing the first semiconductor chip, the second semiconductor chip, and the third semiconductor chip, the case having a first side surface and a second side surface opposite to each other;

a source terminal coupled to the ground-side electrode of the first switching device;

a drain terminal coupled to the power-supply-side electrode of the first switching device;

a power supply terminal for supplying a power supply voltage to the drive circuit;

an input terminal coupled to the drive circuit at an input side thereof; and a ground terminal coupled to the drive circuit at a ground side thereof, wherein the source terminal and the drain terminal extend out from the first side surface of the case, the power supply terminal, the input terminal, and the ground terminal extend out from the second side surface of the case, the first semiconductor chip is arranged such that a distance from the first semiconductor chip to the first side surface is smaller than a distance from the second semiconductor chip to the first side surface, the second semiconductor chip is arranged such that a distance from the second semiconductor chip to the third semiconductor chip is smaller than a distance from the first semiconductor chip to the third semiconductor chip.

\* \* \* \* \*